United States Patent
Kamp et al.

(10) Patent No.: US 9,711,359 B2
(45) Date of Patent: Jul. 18, 2017

(54) SHADOW TRIM LINE EDGE ROUGHNESS REDUCTION

(71) Applicant: Lam Research Corporation, Fremont, CA (US)

(72) Inventors: Tom A. Kamp, San Jose, CA (US); Rodolfo P. Belen, Jr., Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/826,088

(22) Filed: Aug. 13, 2015

(65) Prior Publication Data

US 2017/0047224 A1 Feb. 16, 2017

(51) Int. Cl.
| | |
|---|---|
| *H01L 21/302* | (2006.01) |
| *H01L 21/461* | (2006.01) |
| *B44C 1/22* | (2006.01) |
| *C03C 15/00* | (2006.01) |
| *C03C 25/68* | (2006.01) |
| *C23F 1/00* | (2006.01) |
| *H01L 21/033* | (2006.01) |
| *H01L 21/311* | (2006.01) |
| *H01L 21/027* | (2006.01) |
| *H01L 21/02* | (2006.01) |
| *H01L 21/3065* | (2006.01) |
| *H01L 21/308* | (2006.01) |

(52) U.S. Cl.
CPC ...... *H01L 21/0338* (2013.01); *H01L 21/0217* (2013.01); *H01L 21/0276* (2013.01); *H01L 21/02164* (2013.01); *H01L 21/0332* (2013.01); *H01L 21/0335* (2013.01); *H01L 21/0337* (2013.01); *H01L 21/308* (2013.01); *H01L 21/3065* (2013.01); *H01L 21/3081* (2013.01); *H01L 21/31116* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 6,753,266 B1 * | 6/2004 | Lukanc | H01L 21/0337 257/E21.038 |
| 7,135,419 B2 | 11/2006 | Chandhok et al. | |
| 7,459,363 B2 * | 12/2008 | Subramanian | G03F 7/40 257/E21.256 |
| 2010/0173498 A1 * | 7/2010 | Abatchev | H01L 21/0337 438/704 |

(Continued)

*Primary Examiner* — Stephanie Duclair
(74) *Attorney, Agent, or Firm* — Beyer Law Group LLP

(57) ABSTRACT

A method for etching an etch layer in a stack over a substrate wherein the etch layer is under a mask layer which is under a patterned organic mask is provided. The stack and substrate is placed on a support in the plasma chamber. A silicon based layer is deposited in situ over the stack. The silicon based layer is etched to form silicon based sidewalls or spacers on sides of the patterned organic mask. The mask layer is selectively etched with respect to the silicon based sidewalls or spacers, wherein the selectively etching the mask layer undercuts the silicon based sidewalls or spacers. The etch layer is selectively etched with respect to the mask layer. The stack and substrate are removed from the support and the plasma chamber.

8 Claims, 6 Drawing Sheets

(56) References Cited

U.S. PATENT DOCUMENTS

2011/0256727 A1* 10/2011 Beynet .............. H01L 21/02222
438/703
2015/0102465 A1* 4/2015 Chen .................. H01L 21/3065
257/616

* cited by examiner

9,711,359 B2

SHADOW TRIM LINE EDGE ROUGHNESS REDUCTION

BACKGROUND

The present disclosure relates to the formation of semiconductor devices. More specifically, the disclosure relates to the formation of semiconductor devices require etching features.

During semiconductor wafer processing during an etch, different plasma processes may be used.

This background is not an admission of prior art.

SUMMARY

To achieve the foregoing and in accordance with the purpose of the present disclosure, a method for etching an etch layer in a stack over a substrate wherein the etch layer is under a mask layer which is under a patterned organic mask is provided. The stack and substrate are placed on a support in the plasma chamber. A silicon based layer is deposited in situ over the stack. The silicon based layer is etched to form silicon based sidewalls or spacers on sides of the patterned organic mask. The mask layer is selectively etched with respect to the silicon based sidewalls or spacers, wherein the selectively etching the mask layer undercuts the silicon based sidewalls or spacers. The etch layer is selectively etched with respect to the mask layer. The stack and substrate are removed from the support and the plasma chamber.

In another manifestation, a method of for etching a silicon or metal based etch layer in a stack over a substrate wherein the etch layer is under a carbon based mask layer which is under a patterned organic mask is provided. The stack and substrate are placed on a support in the plasma chamber. A silicon based layer is in situ deposited over the stack. The silicon based layer is etched to form silicon based sidewalls or spacers on sides of the patterned organic mask. The carbon based mask layer is selectively etched with respect to the silicon based sidewalls or spacers and the silicon or metal based etch layer, wherein the selectively etching the carbon based mask layer undercuts the silicon based sidewalls or spacers, comprising flowing an oxygen based etch gas into the plasma chamber, forming a plasma from the oxygen based etch gas, and stopping the flow of the oxygen based etch gas. The silicon or metal based etch layer is selectively etched with respect to the mask layer, while simultaneously removing the silicon based sidewalls. The stack and substrate are removed from the support and the plasma chamber.

These and other features will be described in more detail below in the detailed description and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
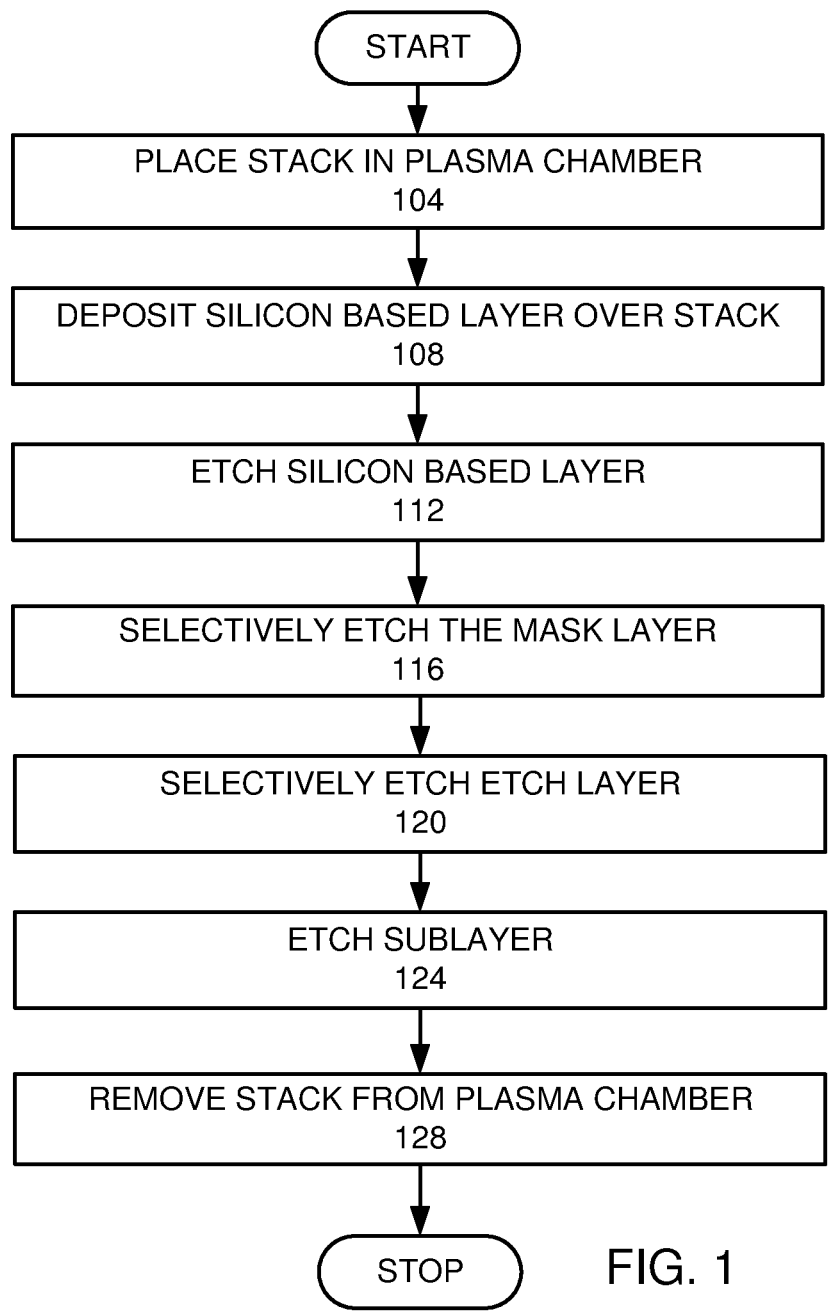
FIG. 1 is a high level flow chart of a process that may be used in an embodiment.

To facilitate understanding, FIG. 1 is a high level flow chart of an embodiment. A stack with a patterned organic mask over a mask layer over an etch layer over a sublayer is placed on a substrate support in a plasma chamber (step 104). A silicon based layer is deposited over the stack (step 108). The silicon based layer is etched (step 112) forming a spacer around the patterned mask. The mask layer is selectively etched with respect to the silicon based layer (step 116), while undercutting the spacer and trimming the mask layer. The etch layer is selectively etched (step 120). The sublayer is selectively etched (step 124). The stack is removed from the plasma chamber (step 128).

EXAMPLE

Figure 2A:
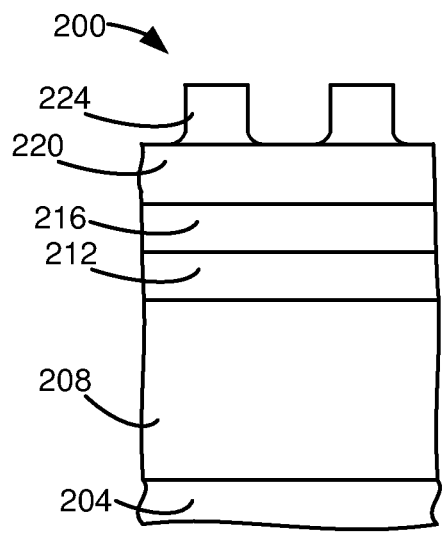
FIGS. 2A-F are schematic cross-sectional views of a stack processed according to an embodiment.

In an example of an implementation of the invention, a stack is placed on a substrate support in a plasma chamber (step 104). FIG. 2A is a cross sectional view of a stack 200 with a substrate 204 disposed below one or more intermediate layers 208, disposed below a sublayer 212, disposed below an etch layer 216, disposed below a mask layer 220, disposed below a patterned organic mask 224. In this example, the patterned organic mask 224 is a photoresist mask, the mask layer 220 is a bottom antireflective coating (BARC), which is made of an organic material, the etch layer 216 is a dielectric antireflective coating (DARC), which is of a silicon based material, and the sublayer 220 is a carbon layer. Preferably, the mask layer 220 of BARC is of a material that may be etched with an oxygen plasma alone and the etch layer 216 of DARC is of a material that is not etched by an oxygen plasma alone.

Figure 3A:
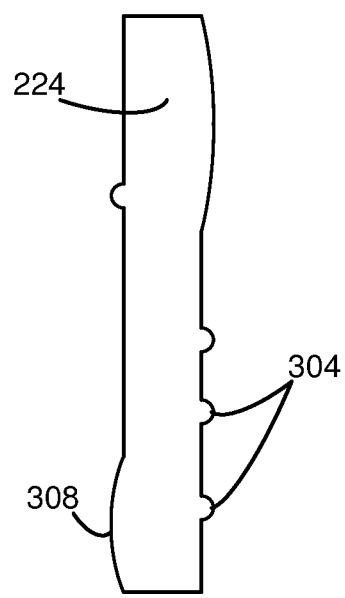
FIGS. 3A-F are top views of a line of the stack processed according to an embodiment.

The patterned organic mask 224 has a footer, which increase the line edge roughness (LER) of the patterned organic mask 224. FIG. 3A is a top view of a line of the patterned organic mask 224. The line has both high frequency line edge roughness 304 and low frequency line edge roughness 308.

Figure 4:
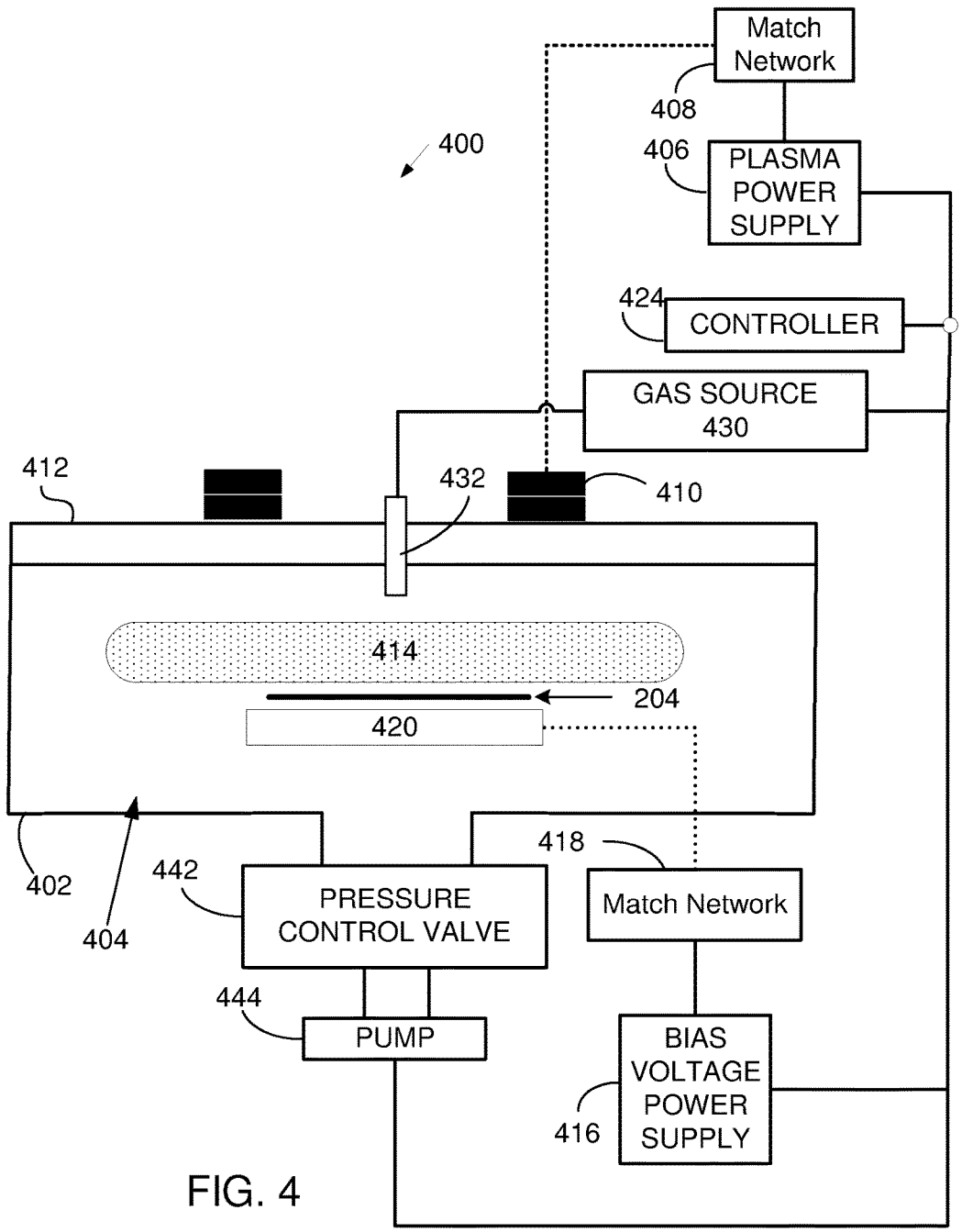
FIG. 4 is a schematic view of a plasma processing chamber that may be used in practicing the embodiment.

FIG. 4 schematically illustrates an example of a plasma processing system 400 which may be used to perform the process of etching the etch layer 208 in accordance with one embodiment of the present invention. The plasma processing system 400 includes a plasma reactor 402 having a plasma processing chamber 404 therein. A plasma power supply 406, tuned by a match network 408, supplies power to a transformer coupled plasma (TCP) coil 410 located near a power window 412 to create a plasma 414 in the plasma processing chamber 404 by providing an inductively coupled power. The TCP coil (upper power source) 410 may be configured to produce a uniform diffusion profile within the plasma processing chamber 404. For example, the TCP coil 410 may be configured to generate a toroidal power distribution in the plasma 414. The power window 412 is provided to separate the TCP coil 410 from the plasma processing chamber 404 while allowing energy to pass from the TCP coil 410 to the plasma processing chamber 404. A wafer bias voltage power supply 416 tuned by a match network 418 provides power to an electrode 420 to set the bias voltage on the substrate 204 which is supported by the electrode 420. A controller 424 sets points for the plasma power supply 406 and the wafer bias voltage power supply 416.

The plasma power supply 406 and the wafer bias voltage power supply 416 may be configured to operate at specific radio frequencies such as, for example, 13.56 MHz, 27 MHz, 2 MHz, 400 kHz, or combinations thereof. Plasma power supply 406 and wafer bias voltage power supply 416 may be appropriately sized to supply a range of powers in order to achieve desired process performance. For example, in one embodiment of the present invention, the plasma power supply 406 may supply the power in a range of 50 to 5000 Watts, and the wafer bias voltage power supply 416 may supply a bias voltage of in a range of 20 to 2000 V. In addition, the TCP coil 410 and/or the electrode 420 may be comprised of two or more sub-coils or sub-electrodes, which may be powered by a single power supply or powered by multiple power supplies.

As shown in FIG. 4, the plasma processing system 400 further includes a gas source/gas supply mechanism 430. The gas source/gas supply mechanism 430 provides gas to a gas inlet 432. Process gases and byproducts are removed from the plasma processing chamber 404 via a pressure control valve 442 and a pump 444, which also serve to maintain a particular pressure within the plasma processing chamber 404. The gas source/gas supply mechanism 430 and pump 444 are controlled by the controller 424. A Kiyo by Lam Research Corp. of Fremont, Calif., may be used to practice an embodiment.

Figure 5:
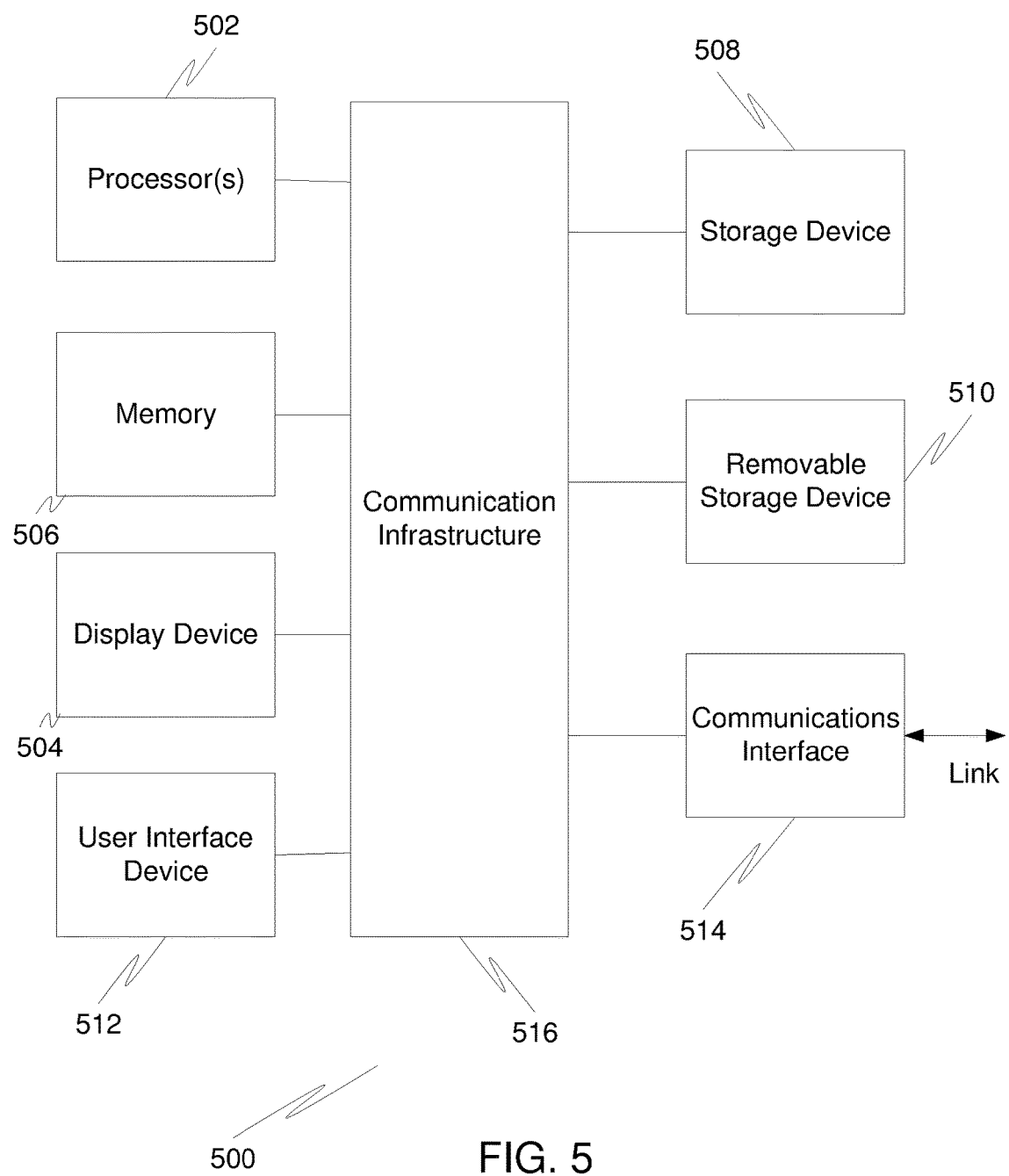
FIG. 5 illustrates a computer system, which is suitable for implementing a controller used in embodiments.

FIG. 5 is a high level block diagram showing a computer system 500, which is suitable for implementing a controller 424 used in embodiments of the present invention. The computer system may have many physical forms ranging from an integrated circuit, a printed circuit board, and a small handheld device up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
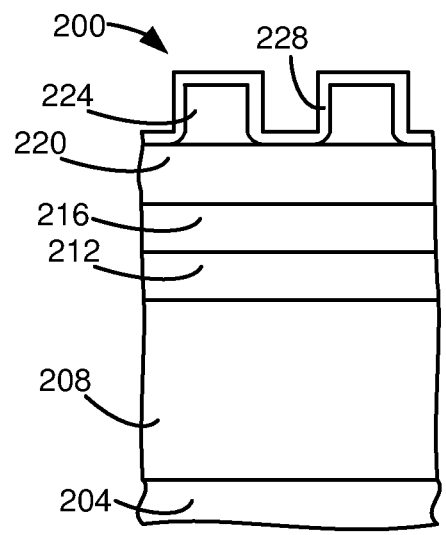
Figure 3B:
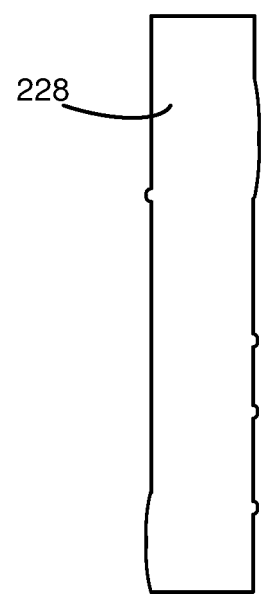

A silicon based layer is in-situ deposited over the stack (step 108). Preferably, the silicon based layer is a conformal layer. In this example, the silicon based layer is silicon oxide. An example of a recipe for forming a conformal silicon oxide layer provides $SiCl_4$ and $O_2$ or in another embodiment provides $SiF_4$ and $O_2$ FIG. 2B is a cross sectional view of the stack 200 after a conformal silicon oxide layer 228 has been deposited over the stack 200. FIG. 3B is a top view of the line after the conformal silicon oxide layer 228 has been deposited over the stack. Some of the LER is reduced by the conformal deposition of the silicon oxide layer 228.

Figure 2C:
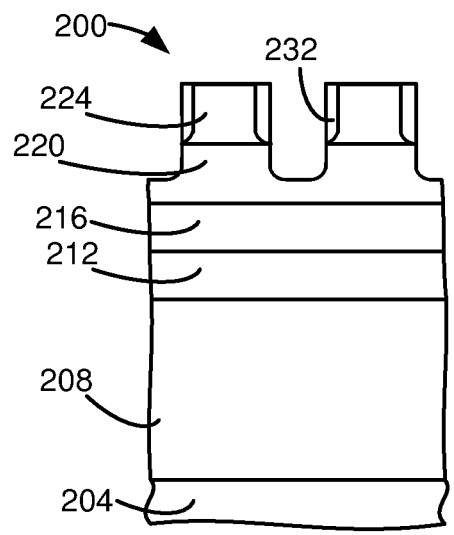

The silicon based layer 228 is etched to form silicon based sidewalls (step 112). Preferably, the etch is more vertical and etches horizontal surfaces of the silicon based layer 228 with respect to vertical surfaces of the silicon based layer 228 in order to form the silicon based sidewalls or spacers 232, as shown in FIG. 2C. An example of a recipe for etching the silicon based layer may contain one or many of the following gases with plasma: $HBr$, $Cl_2$, $CF_4$, $CH_2F_2$, $SF_6$, $CHF_3$, $O_2$, $H_2$, $NH_3$, or $NF_3$.

Figure 3C:
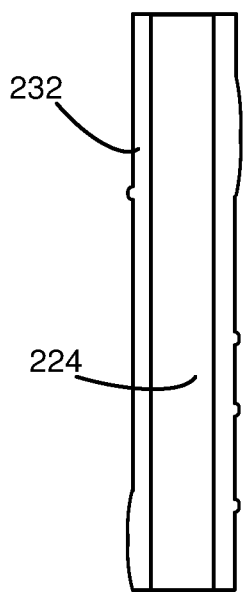

FIG. 2C is a cross sectional view of the stack 200 after the silicon based layer has been opened forming the sidewall spacers 232 and recessing into the BARC mask layer 220. FIG. 3C is a top view of the line after the silicon based layer has been etched to form silicon based sidewalls 232. The top of the patterned organic mask 224 is exposed.

Figure 2D:
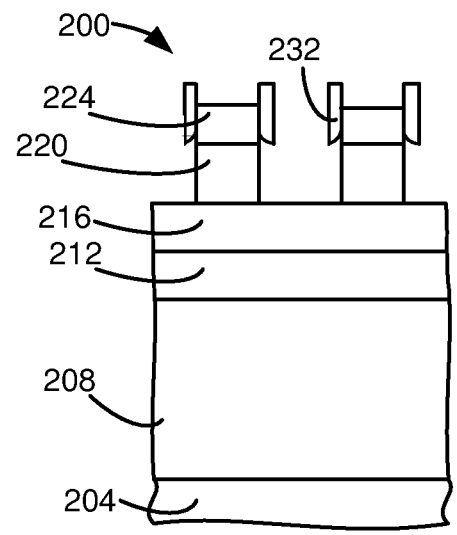
Figure 3D:
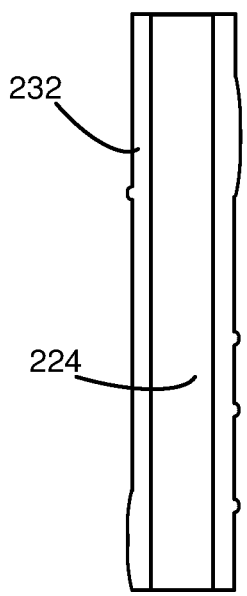

The mask layer is selectively etched with respect to the silicon based sidewalls, so that the silicon based sidewalls are undercut (step 116) and the underlying mask layer 220 trimmed a bit, as shown in FIG. 2D. An example recipe would flow an oxygen gas from the gas source 430 into the plasma chamber. The oxygen gas is formed into a plasma. The mask layer 220 is etched and laterally trimmed to undercut the silicon based sidewalls 232, which exposes the footer of the patterned organic mask 224. This reduces line edge roughness by pulling in the bumps and residual footers of the patterned organic mask 224. The patterned organic mask 224 is also partially etched within the spacers. The flow of the oxygen gas is then stopped. The mask layer 220 and the patterned organic mask 224 have been trimmed to undercut the silicon based sidewalls 232. The top of the patterned organic mask 224 has been partially etched away. FIG. 3D is a top view of the line after the mask layer has been selectively etched. Since this is a top view, the undercut is not shown.

Figure 2E:
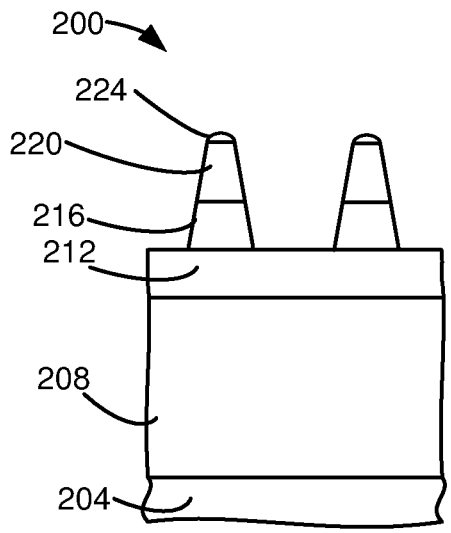

The Si based etch layer 216 is selectively etched with respect to the mask layer 220 (step 120). Gases used could include on or several of the following HBr, $Cl_2$, $CF_4$, $CH_2F_2$, $SF_6$, $CHF_3$, $O_2$, $H_2$, $NH_3$, or $NF_3$. FIG. 2E is a cross sectional view of the stack 200 after the etch layer 216 has been selectively etched.

Figure 3E:

FIG. 3E is a top view of the line after the etch layer 216 has been selectively etched. Since the etch layer 216 and the silicon based sidewalls are both silicon based, the silicon sidewalls are etched away during the etching of the etch layer 216. This leaves the mask layer 220 and the patterned organic mask 224 to act as a mask for etching the etch layer 216. Since the selectively etching the mask layer 220 undercut the silicon based sidewalls and etched footers of the patterned organic mask 224, the line edge roughness caused by the footer of the patterned organic mask 224 is reduced. As a result, the LER of the line formed by the etch layer 216 is reduced, as shown in FIG. 3E.

In some embodiments, the etch layer 216 is used as a mask to etch the sublayer 212 (step 124). In this example, the sublayer 212 is a carbon based layer. An oxygen based plasma is used to selectively etch the sublayer 212 with respect to the etch layer 216.

Figure 2F:
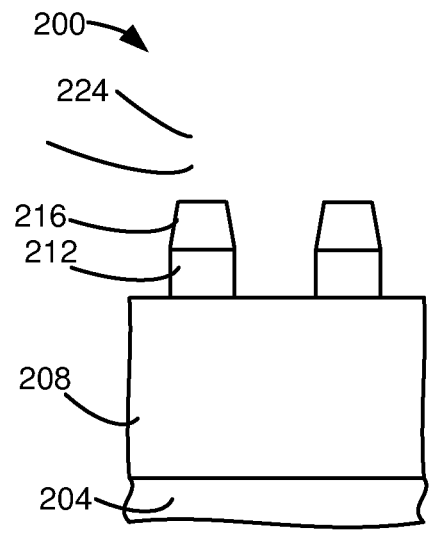
Figure 3F:
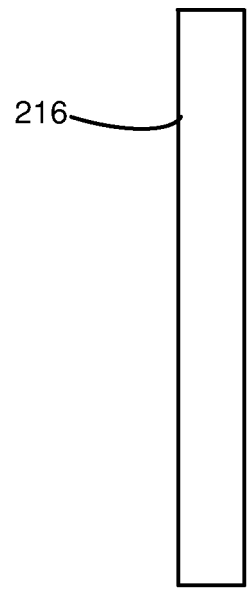

FIG. 2F is a cross sectional view of the stack after the sublayer 212 is etched. FIG. 3F is a top view of the line after the sublayer 212 is etched. In this example, since the patterned organic mask, the mask layer, and the sublayer 212 are all carbon based, the etching of the sublayer 212 removes the mask layer and the patterned organic mask.

In various embodiments, subsequent steps may remove the etch layer and/or etch the one or more intermediate layers 208 and/or etch the substrate 204. The stack 200 is removed from the substrate support and the plasma chamber (step 128).

This embodiment reduces both high frequency and low frequency LER. This embodiment is an in situ process. The spacers formed in this embodiment are used to protect line sidewalls and allows undercutting to expose the transferred photoresist footer and roughness. This exposure allows a trim or foot pull back under the spacers. Pulling in or trimming back the foot removes LER. Large bumps will be more exposed and therefore will have greater pulback or trim. This embodiment also reduces line width roughness and side-wall roughness.

In different embodiments, the silicon based layer may be silicon oxide or silicon nitride or a combination thereof. Preferably, organic material is carbon based material and carbon based material organic material. Preferably, the carbon based material is etched with an oxygen plasma. In another embodiment, the silicon based sidewalls are removed after selectively etching the mask layer and before selectively etching the etch layer.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching a silicon or metal based etch layer in a stack over a substrate wherein the etch layer is under a carbon based mask layer which is under a patterned organic mask, comprising:

placing the stack and substrate on a support in the plasma chamber;

in situ depositing a silicon based layer over the stack, wherein the silicon based layer is a silicon oxide or silicon nitride based layer;

etching the silicon based layer to form silicon based sidewalls or spacers on sides of the patterned organic mask;

selectively etching the carbon based mask layer with respect to the silicon based sidewalls or spacers and the silicon or metal based etch layer, wherein the selectively etching the carbon based mask layer undercuts the silicon based sidewalls or spacers, comprising;

flowing an oxygen based etch gas into the plasma chamber;

forming a plasma from the oxygen based etch gas; and stopping the flow of the oxygen based etch gas selectively etching the silicon or metal based etch layer with respect to the carbon based mask layer and simultaneously removing the silicon based sidewalls; and removing the stack and substrate from the support and the plasma chamber.

2. The method, as recited in claim 1, wherein the selectively etching the carbon based mask layer selectively etches the carbon based mask layer with respect to the silicon or metal based etch layer.

3. The method, as recited in claim 2, wherein the carbon based mask layer is a BARC layer.

4. The method, as recited in claim 3, wherein the silicon or metal based etch layer is over a sublayer, further comprising etching the sublayer after etching the silicon or metal based etch layer.

5. The method, as recited in claim 4, wherein the silicon or metal based etch layer is a DARC layer.

6. The method, as recited in claim 5, wherein the silicon based layer is a silicon oxide or silicon nitride based layer.

7. The method, as recited in claim 6, wherein organic mask is a photoresist mask.

8. The method, as recited in claim 7, wherein the plasma chamber is an inductively coupled plasma chamber.

* * * * *